United States Patent [19]
Redington et al.

[11] Patent Number: 4,618,827
[45] Date of Patent: Oct. 21, 1986

[54] METHOD FOR HIGH-SPATIAL-RESOLUTION SPECTROSCOPIC NMR IMAGING OF CHEMICALLY-SHIFTED NUCLEI

[75] Inventors: Rowland W. Redington, Schenectady, N.Y.; Leon Axel, Philadelphia, Pa.

[73] Assignee: General Electric Company, Schenectady, N.Y.

[21] Appl. No.: 648,567

[22] Filed: Sep. 10, 1984

[51] Int. Cl.$^4$ ............................................. G01R 33/20
[52] U.S. Cl. .................................................... 324/309
[58] Field of Search ............... 324/307, 309, 312, 308; 364/413; 128/653

[56] References Cited

U.S. PATENT DOCUMENTS

| | | | |
|---|---|---|---|
| 4,471,305 | 9/1984 | Crooks et al. | 324/309 |
| 4,509,015 | 4/1985 | Ordidge et al. | 324/309 |
| 4,520,316 | 5/1985 | Hall et al. | 324/309 |
| 4,570,119 | 2/1986 | Wehrli et al. | 324/309 |
| 4,570,120 | 2/1986 | Hall et al. | 324/309 |

Primary Examiner—Stewart J. Levy
Assistant Examiner—Kevin D. O'Shea
Attorney, Agent, or Firm—Geoffrey H. Krauss; James C. Davis, Jr.; Marvin Snyder

[57] ABSTRACT

An improved method for providing a high-spatial-resolution NMR image, having resolved artifact-free NMR images of chemically-shifted nuclei, includes: forming a pair of NMR images each having imaging components of each of the chemically-shifted nuclei due to projections in one of a pair of opposite directions along a common line; mirroring the imaging components of one of the NMR images about a line orthogonal to the common line; registering and combining the mirrored image and the other image to eliminate a first one of the components and thus produce a composite image containing only the other component and a negative of the other component offset by twice the chemical shift; and forming a resolved image of the other component by processing the composite image to eliminate the offset negative image. The resolved image may then be combined with one or more of the NMR images to produce a resolved image of the first component. The method requires only 2N projections to form the two N-by-N NMR images.

19 Claims, 8 Drawing Figures

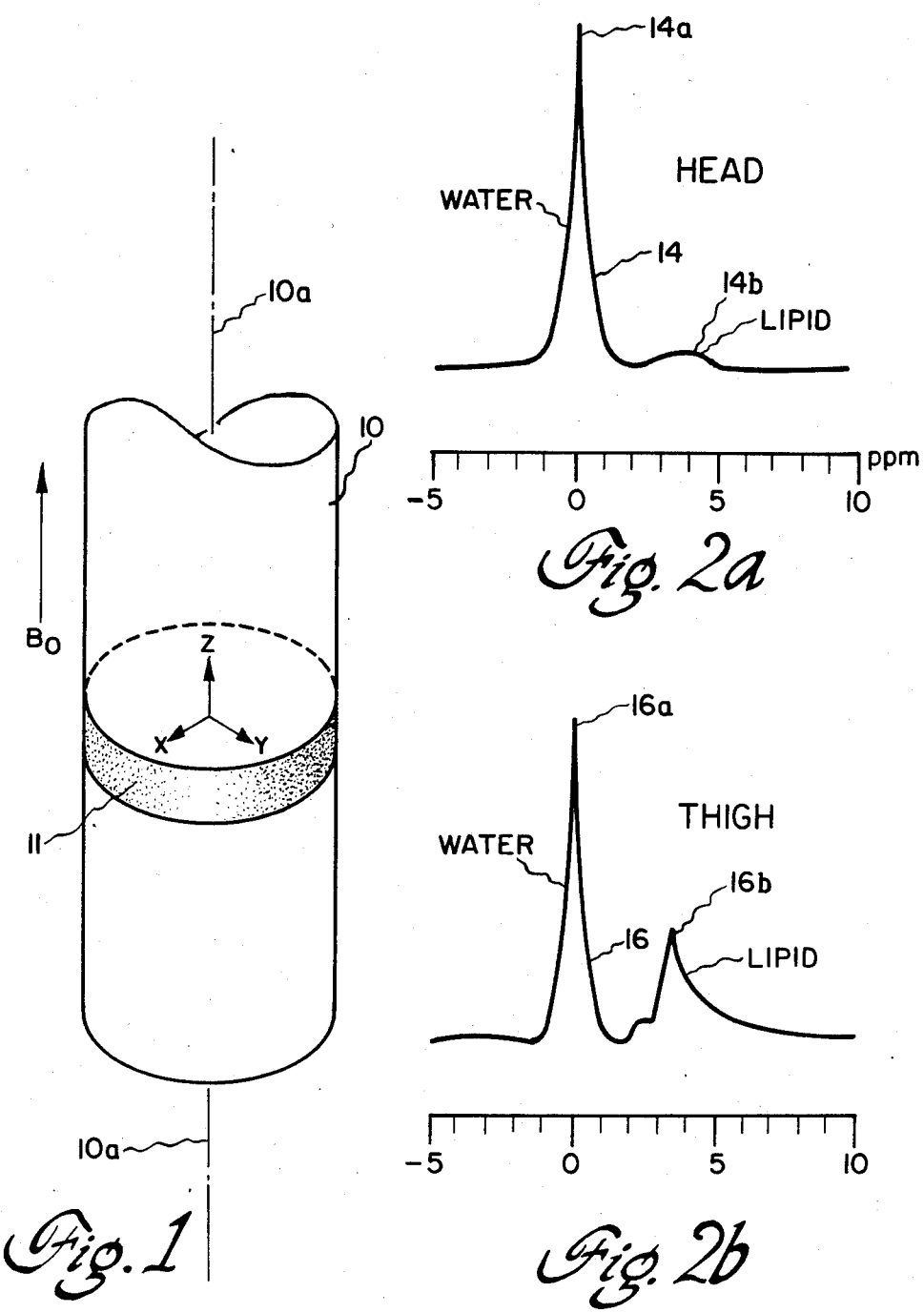

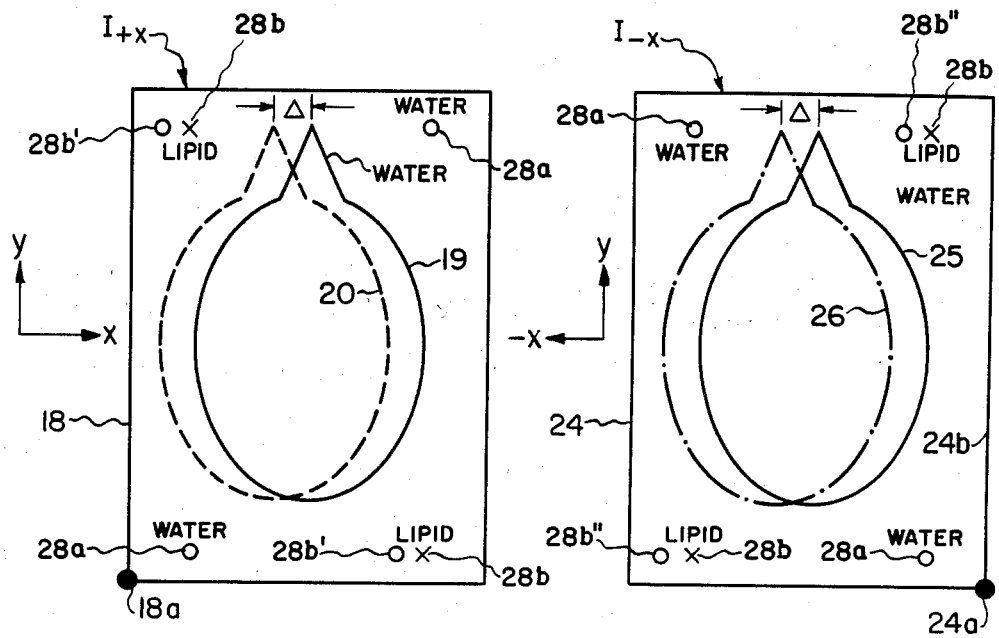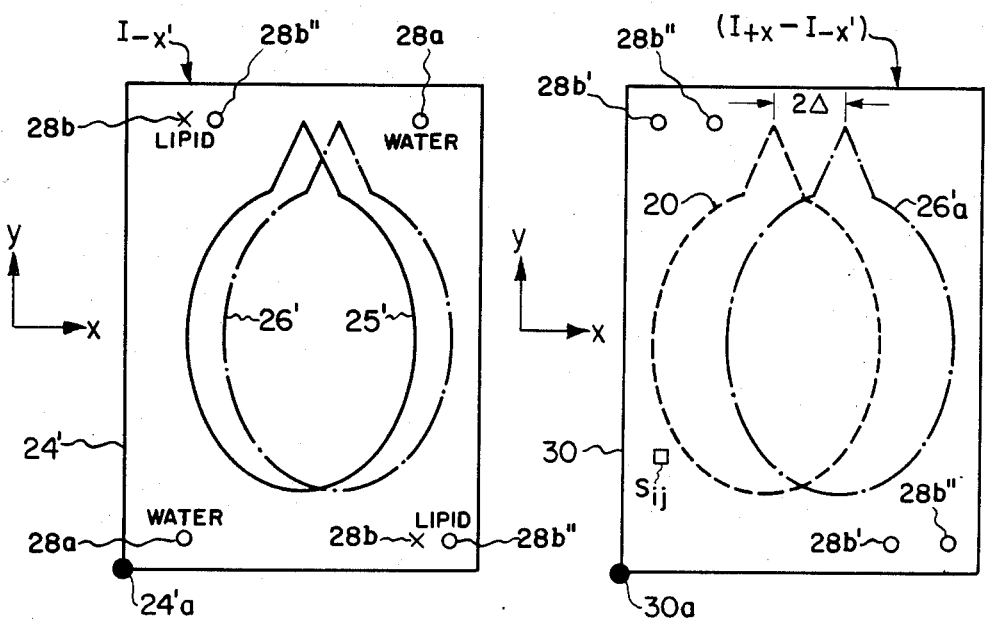

Fig. 5

$$L_{ij} = S_{ij} + L_{i,j-2\Delta}$$

Table of cells (rows $i=1..6$, columns $j=1..6$):

| | $j=1$ | $j=2$ | $j=3$ | $j=4$ | $j=5$ | $j=6$ |
|---|---|---|---|---|---|---|
| $i=1$ | $L_{11}=S_{11}$ | $L_{12}=S_{12}$ | $L_{13}=S_{13}+L_{11}$ | $L_{14}=S_{14}+L_{12}$ | $L_{15}=S_{15}+L_{13}$ | $L_{16}=S_{16}+L_{14}$ |
| $i=2$ | $L_{21}=S_{21}$ | $L_{22}=S_{22}$ | $L_{23}=S_{23}+L_{21}$ | $L_{24}=S_{24}+L_{22}$ | $L_{25}=S_{25}+L_{23}$ | $L_{26}=S_{26}+L_{24}$ |
| $i=3$ | $L_{31}=S_{31}$ | $L_{32}=S_{32}$ | $L_{33}=S_{33}+L_{31}$ | $L_{34}=S_{34}+L_{32}$ | $L_{35}=S_{35}+L_{33}$ | $L_{36}=S_{36}+L_{34}$ |
| $i=4$ | $L_{41}=S_{41}$ | $L_{42}=S_{42}$ | $L_{43}=S_{43}+L_{41}$ | $L_{44}=S_{44}+L_{42}$ | $L_{45}=S_{45}+L_{43}$ | $L_{46}=S_{46}+L_{44}$ |
| $i=5$ | $L_{51}=S_{51}$ | $L_{52}=S_{52}$ | $L_{53}=S_{53}+L_{51}$ | $L_{54}=S_{54}+L_{52}$ | $L_{55}=S_{55}+L_{53}$ | $L_{56}=S_{56}+L_{54}$ |
| $i=6$ | $L_{61}=S_{61}$ | $L_{62}=S_{62}$ | $L_{63}=S_{63}+L_{61}$ | $L_{64}=S_{64}+L_{62}$ | $L_{65}=S_{65}+L_{63}$ | $L_{66}=S_{66}+L_{64}$ |

COLUMNS

ROWS $I_{+x}$, $I_{-x}$

METHOD FOR HIGH-SPATIAL-RESOLUTION SPECTROSCOPIC NMR IMAGING OF CHEMICALLY-SHIFTED NUCLEI

BACKGROUND OF THE INVENTION

This invention relates to nuclear magnetic resonance (NMR) imaging and, more particularly, to an improved method for enabling high-spatial-resolution spectroscopic NMR imaging with selected nuclei of a sample containing nuclei having chemically-shifted NMR frequencies.

As is well known, the nuclear magnetic resonance phenomenon is exhibited by atomic nuclei with an odd number of either protons or neutrons. Such nuclei possess spin, which endows them with a small magnetic field. When placed in an externally applied static main magnetic field $B_o$, the nuclei tend to align themselves with the applied field and produce a net magnetization M in the direction of the applied field. The nuclei oscillate, or precess, about the axis of the applied field with a characteristic NMR frequency, $\omega_o$, given by the Larmor equation:

$$\omega_o = \gamma B_o \qquad (1)$$

where $\gamma$ is the gyromagnetic ratio and is constant for each NMR isotope. The NMR precession frequency is directly proportional to the applied field $B_o$. If a time-dependent radio-frequency (RF) magnetic field, having a frequency component equal to the Larmor frequency of the nuclei, is applied in a direction orthogonal to the main field, then the nuclei will absorb energy and nutate away from the axis of the main field and commence to precess at the Larmor frequency about the new net applied field direction. When the RF field is turned off, the nuclei emit NMR signals at their characteristic Larmor frequency, which signals decay as the nuclei relax or return to equilibrium in alignment with the main field. These NMR signals may be detected and Fourier transformed to derive the frequency components of the NMR signals which are characteristic of the nuclei.

Nuclei of the same isotope can exhibit minute variations in their NMR frequencies, which are referred to as chemical shifts, because of differences in their chemical environments which cause differences in their magnetic field environments. Chemical shifts result from alterations of the magnetic field around nuclei as a result of the shielding currents that are associated with the distribution of electrons around adjacent atoms. The degree of shielding is characteristic of the environment of the nucleus, and thus the chemical-shift spectrum of a given molecule is unique and can be used for identification. In conventional NMR spectroscopy, the chemical structure of the sample is studied by observing the chemically-shifted signals returned from an NMR experiment. Because the resonant frequency and the absolute chemical shift are dependent upon the strength of the field, the chemical shift is expressed as a fractional shift in parts-per-million (ppm) of the resonant frequency relative to an arbitrary reference compound.

Since the Larmor frequency is proportional to the magnetic field, if the magnetic field varies spatially in a sample, then so does the resonant frequency of the nuclei. In NMR imaging, one or more magnetic field gradients are applied to the sample to spatially encode the emitted NMR signals. By applying an RF excitation pulse (having a narrow range of frequency components) to the sample in the presence of gradients, the nuclei in a selected region, e.g., a planar slice, or at a selected point, of the sample can be selectively excited and their NMR response signals detected. The data collected from different regions or points the sample can be processed in a well-known manner to construct an image.

NMR imaging in the past has typically been performed in rather low magnetic fields and chemical shifts have not been a significant problem. In magnetic fields below about 0.7 Tesla (T), chemical shifts are difficult to observe because of the natural linewidths of the resonances and the low sensitivity of nuclei other than hydrogen ($^1H$). It is desirable, however, to perform NMR imaging in higher magnetic fields, in excess of 1 T for example, because of the improved signal-to-noise ratios realized; recent advances in magnet technology permit the use of higher magnetic fields, of the order of 1–1.5 T, in medical and biological NMR imaging. As the magnetic field increases, the chemical-shift increases proportionately and becomes a greater problem. Chemical shift can produce the same effect as a spatial variation in the NMR signal. This results in chemical shift artifacts which are manifested, for example, as ghosts in two-dimensional-Fourier-transform (2DFT) imaging. Ghost artifacts may appear as a faint ring or ghost at one side of an image, and such ghosts both obliterate some of the spatial information present and reduce spatial resolution.

In proton imaging of the body, the chemical shift observed is principally between the hydrogens attached to oxygen in water and the hydrogens attached to carbon in $CH_2$ lipid (fat) tissue; this chemical shift is on the order of 3 ppm. The effect of the chemical shift is to produce two superimposed images; one image is the water image and the other image is the lipid image, which is shifted along the axis on which the projection was made by an amount corresponding to the chemical shift. At magnetic field strengths on the order of $B_o = 1.5$ T, for example, the chemical shift results in an artifact in the NMR image and is a significant problem.

It is desirable to provide NMR imaging methods that permit separation of superimposed chemically-shifted images, such as those of an aqueous proton image and a lipid proton image, into distinct images so as to remove chemical-shift artifacts and improve the spatial resolution in the images. Separate resolved images are also desirable for other reasons. For example, an image constructed from lipid protons alone may be useful for looking at fat or atherosclerotic lesions or plaques in blood vessels, as well as for the evaluation of heart disease.

One approach which may be useful for separating the images is resolved-spectroscopy, which employs selective slice excitation, pulse gradient (phase) encoding in both x and y directions (to avoid blurring out the spectroscopic information by having a gradient on when the free induction decay (FID) is collected), and finally a Fourier transformation from the time domain to the frequency domain for each point of the imaging plane, i.e., at each pixel of the display. For an image array comprising N-by-N pixels, this approach requires $N^2$ projections. For example, a 256-by-256 array would require 65,536 projections to produce two resolved images. The amount of time required for this number of projections would be unreasonable, making a resolved-spectroscopy approach impractical.

In co-pending application Ser. No. 565,305, filed Dec. 27, 1983, U.S. Pat. No. 4,581,582, assigned to the same assignee of the present application and incorporated herein in its entirety by reference, one of the present inventors describes and claims a method of NMR imaging that enables superimposed images, produced by chemically-shifted nuclei and formed as projections along first and second lines that extend in different, preferably orthogonal, directions to be resolved and separated into distinct chemical-shift images. EAch NMR image contains first and second image components respectively produced by first and second chemically-shifted nuclei in the sampled region. After one of the pair of NMR images is registered with the other image by registering the first image components, the two images are combined to subtractively eliminate the first image components and to produce a composite image containing the second image components. This process requires that the same degree of imaging linearity be obtained along both projection lines, which are typically in orthogonal directions. Since all gradient magnetic fields (used to establish the lines of projection) are less than perfectly linear in real-world imaging apparatus, it is extremely difficult to provide identical spatial and temporal distortion along the substantially orthogonal projection axes; any non-identical distortion results in the undesired effects, even though such effects are reduced in scope.

BRIEF SUMMARY OF THE INVENTION

In accordance with the invention, an improved method of NMR imaging is provided that enables superimposed images, produced by chemically-shifted nuclei and formed as projections in opposite directions along a line (or imaging axis), to be resolved and separated into distinct chemical-shift images which are more nearly artifact-free and which have high spatial resolution. Each NMR image comprises first and second image components respectively produced by first and second chemically-shifted nuclei in the sampled region. One of the pair of NMR images is converted to its mirror image by rotation around that axis orthogonal to the common projection axis, and is then registered with the other image by registering the first image components, for example. The registered images are subtractively combined to eliminate the first image components and to produce a composite image containing a spatially-separated pair of second image components.

Once a composite image containing only the second image component has been obtained, the composite image may be processed to remove artifacts in the second image component composite image and/or may then be combined with one (or both) of the NMR images to produce another resolved image containing only the first image components.

Stated somewhat differently, the data corresponding to NMR images taken in opposite directions along the same projection axis are registered (after mirroring of one of the images), combined and processed to produce a resolved image due to only one of a pair of chemically-shifted nuclei. In effect, the invention converts the problem of providing resolved images from each nuclei species to one of data processing, and for an N-by-N image array requires only 2 images, each of N projections, to produce two separate chemical-shift artifact-free images, which is smaller by a factor of N/2 from that required using resolved-spectroscopy techniques. Accordingly, a 256-by-256 image array requires (a) only 512 projections, which represents a significant advantage in data collection time and data processing and (b) allows each image providing data for the image array to be taken with the same image axis used as a projection axis, to negate effects of symmetrical axis gradient field deviations from perfect linearity.

Accordingly, it is one object of the present invention to provide an improved NMR imaging method that enable superimposed chemically-shifted images to be separated and resolved into distinct high-spatial-resolution images that are free from chemical-shift artifacts.

This and other objects of the present invention will become apparent to those skilled in the art upon consideration of the following detailed description, when read in conjunction with the drawings.

BRIEF DESCRIPTION OF THE DRAWINGS

FIG. 1 illustrates diagrammatically an NMR sample situated in a static magnetic field and having a planar volume defined therein by selective excitation;

FIGS. 2a and 2b are 64 MHz. proton ($^1$H) spectra from a human head and thigh, respectively, illustrating two chemically-shifted peaks, respectively corresponding to water and lipid proton response signals;

FIGS. 3a and 3b are diagrammatic views of NMR proton images of a human head taken, respectively, in first and second opposite directions along the same projection axis and illustrate chemically-shifted water and lipid images;

FIG. 3c is a diagrammatic view of the image of FIG. 3b, after "mirroring" of the projection array data to remove the inversion caused by opposite direction projection;

FIG. 4 is a diagrammatic view of a composite lipid image formed by registering and subtractively combining the images of FIGS. 3a and 3c to eliminate the water image; and FIG. 5 is a diagrammatic view illustrating the manner in which the data in each pixel of the composite image of FIG. 4 is processed to provide a resolved lipid image.

DETAILED DESCRIPTION OF THE PREFERRED EMBODIMENT

Our invention is particularly well adapted for use with NMR proton imaging for resolving and separating water and lipid images to produce separate chemical-shift water and lipid images which are essentially artifact-free and have high spatial resolution, and will be described in that environment. However, as will be appreciated, this is illustrative of only one utility of the invention.

Some of the basics of NMR imaging will be briefly reviewed, prior to describing the sequence of steps in our inventive method. Referring first to FIG. 1, an NMR sample 10 is shown. Sample 10 may be cylindrically shaped, for purposes of illustration. The sample is positioned in a static and substantially-homogeneous main magnetic field $B_o$ which is illustratively directed along the positive z-axis direction of a conventional Cartesian coordinate system; the z-axis has been made coincident with the sample axis 10a. The origin of the coordinate system is illustratively taken to be both at the center of the sample, and also at the center of a thin planar slice or imaging volume 11. Sample imaging volume 11 is selected by selective irradiation of the sample in the presence of a magnetic field gradient along the z-axis. NMR imaging typically employs three gradients G(t) for exciting nuclei in selected regions of the sample and for spatially encoding the resulting NMR signals. These gradients G(t) are:

$$G_x(t) = \partial B_o/\partial x \qquad (2)$$

$$G_y(t) = \partial B_o/\partial Y \qquad (3)$$

$$G_z(t) = \partial B_o/\partial z \qquad (4)$$

The orthogonal gradients $G_x$, $G_y$ and $G_z$ are generally functions of time t, and each has associated therewith one of gradient magnetic fields $b_x$, $b_y$ and $b_z$, respectively, wherein $$b_x = G_x(t)x \qquad (5)$$

$$b_y = G_y(t)y \qquad (6)$$

$$b_z = G_z(t)z \qquad (7)$$

NMR images of a selected planar slice 11 of the sample may be formed by a number of well-known methods using conventional NMR imaging apparatus for applying to sample imaging sequences having radio-frequency (RF) magnetic field pulses directed orthogonal to the $B_o$ field (i.e. in the X-Y plane) and gradient magnetic fields, for selectively exciting and detecting NMR signals from different portions of the sample. In two-dimensional-Fourier-transform (spinwarp) imaging, for example, a 90° selective RF pulse is applied to the sample in the presence of a $G_z$ gradient field to excite the nuclei in an imaging volume 11 of selected Z-axis location and thickness. Immediately thereafter, an inverted Gz gradient field is applied to the sample 10 to rephase the nuclei in the selected image volume. The inverted $G_z$ gradient is applied along with both an inverted polarity, e.g., a negative polarity $G_x$ gradient field to advance the position of the resulting NMR signal along the time axis away from the pulses, and a programmable $G_y$ gradient field pulse to phase-encode the nuclei in the y-axis direction. Thereafter, the NMR response signals are collected in the presence of a $G_x$ gradient field which spatially encodes, in the X-axis direction, the NMR signals according to their frequency. During subsequent imaging sequences, different values of the $G_y$ gradient field are employed to give different projections along the x-axis, and a complete planar image is reconstructed by a two-dimensional Fourier transformation of the projections.

To illustrate the effects of chemical shift, data (NMR signals) collected with a projection on the x-axis have a frequency, $\omega$, obtained from the Fourier transformation of the free-induction-decay (FID) response, given by:

$$\omega = \gamma(1+\delta)(B_o + xG_x) \qquad (8)$$

where $\gamma$ is the gyromagnetic ratio, $\delta$ is the difference in chemical shift between the water and the lipid proton species which dominate the usual in vivo ($^1$H) spectra, and x is the spatial location along the x-axis. Equation 8 may be rewritten as:

$$\omega = \omega_o + \delta\gamma B_o + \gamma xG_x + \delta\gamma xG_x \qquad (9)$$

where $\omega_o$ is the Larmor frequency given by $\gamma B_O$, $\gamma xG_x$ is the spatial encoding of x-direction spatial information into frequency information, and the ($\delta\gamma xG_x$) term is completely negligible. Equation 9 may be solved for spatial location as a function of $\omega$ to obtain:

$$x = (\omega - \omega_o - \delta\omega_o)/(\gamma G_x) \qquad (10)$$

Equation 10 indicates that a chemical shift results in a misassignment of the shifted resonant frequency to a nearby spatial location, differing from the "expected" location by:

$$\Delta_x = -\delta\omega_o/\gamma G_x \qquad (11)$$

thereby producing an artifact in the NMR image. In the pulse-gradient-phase-encoding Y-direction, the chemical shift is negligible and produces no noticeable effects.

FIGS. 2a and 2b illustrate 64 MHz. proton spectra 14 and 16 recorded from a human head and thigh, respectively, in a magnetic field of 1.5 T. The two peaks 14a and 14b or 16a and 16b of each spectrum correspond to water and lipid protons, respectively, and the figures show that the chemical shift between the water peaks 14a and 16a and the lipid peaks 14b or 16b is on the order of 3.5 ppm, or about 220 Hz. at a 64 MHz. center frequency. The relative intensities of the water and lipid peaks vary with the tissue studied and with the individual. There is not much fat in the brain, except around the surface, which is why the lipid peak 14b in the head response 14 (FIG. 2a) is smaller than the lipid peak 16b in the response 16 (FIG. 2b) for the thigh. While the lipid in the nerve sheath in the brain apparently has too short a relaxation time to be observed in typical in vivo measurement the lipid peak 14a in the head response 14 is still, however, sufficient to generate a ghost artifact at the periphery of an NMR head image, which serves to obliterate some of the spatial information present.

FIG. 3a represents a spin-warp image 18 of an axial cross-section through a human head and diagrammatically illustrates the effects of chemical-shift artifacts on NMR images. The image is formed from projections on the x-axis, by spatial-frequency encoding in the x-axis direction and pulse-gradient (phase) encoding in the y-axis direction. As shown, the NMR image comprises two superimposed images or image components 19 and 20 that are offset from one another. The solid line image 19 represents a water proton image, and the dotted line image 20 represents a lipid proton image that is offset from the water image 19 by the amount $\Delta$ proportional to the chemical shift difference between the water and lipid protons. As shown, and as indicated in equation 11, the chemical shift causes the image 20 to be offset, with respect to water image 19, by an amount $\Delta_{+x}$ in the direction along the axis along which the projections were made, i.e., the positive x-axis, and toward the orthogonal axis, e.g. the y-axis. The lipid image 20 constitutes a chemical-shift artifact, and in an actual NMR image 18 would appear as a shadow or a ghost at the periphery of the water image 19. The intensity of the lipid image 20 is, of course, related to the density of the lipid protons in the imaging plane and, in general, would be greater for an NMR image of a thigh than for an NMR image of a head, as illustrated e.g. by the relative intensities of the water and lipid peaks in FIGS. 2a and 2b.

FIG. 3b illustrates diagrammatically an NMR image 24 of the same cross-section of the head as FIG. 3a, except that image 24 is, in accordance with the invention, formed responsive to an inverted-polarity x-axis gradient field; as with the image 18 of FIG. 3a, image 24 is formed from projections on the x-axis, by spatial-frequency encoding in the x-axis direction and pulse-gradient (phase) encoding in the y-axis direction. In image 24, the water image 25 and lipid image 26 are offset from one another by the same chemical-shift amount $\Delta$ along the axis, e.g. the x axis, on which the projections were taken. Because the polarity of the projection (x) axis gradient field has been reversed, and the image projected in the reversed axis direction, the separation (as predicted by equation (11)) is $\Delta_{-x} = -\Delta_{+x}$, or of the same magnitude but directed away from the orthogonal y-axis.

Our improved NMR imaging method enables the water images 19 and 25 and lipid images 20 and 26 to be separated from one another into two distinct artifact-free images having high spatial resolution. This is accomplished by forming two NMR images of the same imaging plane using opposite projection directions along the same projection line, e.g., along a line that extends in the direction of one of the coordinate axes. The NMR images may be formed using conventional NMR imaging apparatus and are preferably formed using two-dimensional-Fourier-transform (spin-warp) imaging methods, and any of the well-known 2DFT imaging sequences may be employed for this purpose. For an N-by-N image array comprising $N^2$ pixels, the two images require only 2N projections. For example, a 256-by-256 array requires only 512 projections to form the two images.

As noted above, each of the two NMR images 18 and 24 will comprise two image components, a water component 19 or 25 and a lipid component 20 or 26, that are offset from one another (a) along the axis (e.g. the X-axis) on which the projections are taken and (b) by the amount $\Delta$ of the chemical shift in a direction, relative to the orthogonal axis (the y-axis), determined by the polarity of the gradient field (e.g. $\pm G_X$). If the two NMR images are designated $I_{+x}$ and $I_{-x}$, (where the polarity sign (+ or −) of the subscript indicates the axial direction, referenced to the origin, along which that projections was taken), then the lipid components will be offset to a first side closer to an origin point 18a, e.g. to the left, along the x-axis for the $I_{+x}$ image 18 (FIG. 3a) and will be offset to a second side further from an origin point 24a, e.g. to the left, along the x-axis for the $I_{-x}$ image 24. As the slope of the x-axis gradient field applied for recovering the $I_{-x}$ imaged data is opposite to the slope of the x-axis gradient field applied for recovering the $I_{+x}$ image data and the slope magnitudes are the same, any symmetrical gradient field linearity distortion along the projection, e.g. x, axis can be minimized, while any spatial distortion of the linearity of the gradient field in the orthogonal direction, e.g. the y-direction, is actually the same for both images. The orthogonal-direction gradient field temporal distortion is minimized, as the two images can be done sequentially, or even in interleaved manner, and the number of projections is reduced to 2N (rather than $N^2$), such that the time interval is small between the pair of projections for the same line of pixels. The two images $I_{+x}$ and $I_{-x}$ (each containing the same two water and lipid components) are combined, in three steps described hereinbelow, to form a composite image in which one of the components is eliminated, and the composite image may be processed to produce a resolved image containing only the other component. Once a resolved image of one of the components is obtained, it may be combined with either of the $I_{+x}$ or $I_{-x}$ images (or with both and the results averaged) to obtain a resolved image of the other component. The process is somewhat analogous to solving two simultaneous equations in two unknowns.

To separate the water and lipid components, the $I_{-x}$ image 24 is first "flipped" about the y-axis 24b of the second projection image 24, to obtain a mirror image $I_{-x}'$ having its x-axis now extended in the same direction, e.g. the positive x direction, as the first projection image 18 (FIG. 3a). This mirroring process is straightforwardly carried out by rotation of the N×N data matrix $[A_{NN}]$ into another N×N data matrix $[B_{NN}]$ having the elements along the i-th row thereof, where $1 \leq i \leq N$, obtained in reverse sequence from the i-th row of matrix $[A_{NN}]$; that is, if the i-th row of matrix $[A_{NN}]$ contains elements $A_{i,j}$, where $1 \leq j \leq N$, then the i-th of matrix $[B_{NN}]$ has elements $B_{i,j} = A_{i,(N-j+1)}$. In the second step, the $I_{+x}$ image 18 of FIG. 3a and the $I_{-x}'$ image 24' of FIG. 3c are spatially registered such that one of the components, for example the water component images 19 and 25', of each of the two images are in registration. To assist in spatially registering the images, it is desirable to include reference points 28 for each component in each of the images. This may be accomplished by imaging with small reference samples of each of the components adjacent to the subject sample. For example, a plurality of water bottles 28a and a plurality of lipid bottles 28b may be disposed adjacent to the subject sample so as to appear as reference points in the $I_{+x}$ and $I_{-x}$ images, as illustrated in FIGS. 3a and 3b. As shown, two water bottles 28a may be employed so as to afford two water reference points 28a that appear as small circles adjacent to a pair of opposite corners of the images, and two lipid bottles may be employed to provide two lipid reference points 28b, which appear as shifted points 28b', e.g. shifted to the left in both FIG. 3a and FIG. 3b, and adjacent to the remaining pair of opposite corners of the images. The amount of shift $\Delta$ is, as previously referred to hereinabove, proportional to the chemical-shift value for the involved materials (e.g. about 3.5 PPM for water and lipid, for $B_o$ approximately 1.5 T). The water reference points 28a are aligned to register the water components 19 and 25' of the two images $I_{+x}$ and $I_{-x'}$. Similarly, to register the lipid components 20 and 26', the actual lipid reference points 28b' and 28b'' are aligned. In addition to assisting in registering the two images, the reference points are also desirable for enabling the absolute intensities of the registered components of the two images to be adjusted to be the same so that when the two registered images are combined by subtracting one from the other, the registered component will be eliminated.

After registering a particular component of the two images, the images 18 and 24' may be subtracted, as the third step and as indicated above, to eliminate that component. This results in a composite image which is either totally aqueous or totally lipid; FIG. 4 illustrates a composite lipid image 30 resulting from the subtraction of the mirrored second image $I_{-x}$, from first image $I_{+x}$ when the water images 19 and 25 are registered and adjusted to the same absolute intensities. The composite image 30 contains the desired component (e.g. image 20) plus a negative ghost image 26'a of the desired component offset in the projection direction, e.g. the x-direction, by twice the amount of the chemical shift, i.e. by an amount 2$\Delta$. FIG. 4 illustrates diagrammatically a composite image 30 containing offset lipid image components 20 and 26'a produced by registering the water component of the $I_{+x}$ and $I_{-x'}$ images 18 and 24' of FIGS. 3a and 3c, and subtracting $I_{-x'}$ from $I_{+x}$. The elimination of such a single ghost ($I_{-x'}$) image 26'a, offset by a known amount (i.e. 2Δ) in a given direction (i.e. the x direction) is a rather straightforward signal processing task, and the composite image 30 of FIG. 4 may be processed in the following manner to form a resolved lipid image.

If $S_{ij}=(I_x-I_{-x'})_{ij}$ is the value in pixel ij of the subtracted images, where i and j are integers, and if $L_{ij}$ is the desired, i.e., resolved, image value, then $$S_{ij}=L_{ij}-L_{i,j-\delta x} \qquad (12)$$

and $$L_{ij}=S_{ij}+L_{i,j-\delta x} \qquad (13)$$

where $\delta_x$ is the chemical shift (i.e. 2Δ) measured in pixels of the images in the x direction, and $(-L_{i,j-\delta x})$ represents the negative offset ghost. The sign of $\delta_x$ will depend, of course, on the relative positions of the subtracted $I_{+x}$ and $I_{-x'}$ images, and it is a relatively simple manner to adjust the gradient field of the NMR imaging apparatus such that the chemical-shift 2Δ in the selected projection direction, e.g. the x direction, corresponds to an integral number M of pixels. For the signs used in equations 12 and 13, the negative ghost is assumed to be shifted to the right (as shown by the $I_{-x'}$ (lipid) image 26'a, or by the lipid samples 28b″ with respect to samples 28b′ in FIG. 4, so that the resolved image can be calculated by progressing through the composite image from left to right in the Figure, one row at a time. Accordingly, L=0 if either of its indexes, i.e., subscripts, is negative.

FIG. 5 illustrates diagrammatically the application of the foregoing process to the composite image of FIG. 4 to produce a resolved lipid image. For purposes of illustration, a 6-by-6 pixel subarray of the image array 40 is shown, although in practice much larger pixel arrays (256-by-256, for example) are employed; the chemical shift, δ, is assumed to be exactly two pixels in the +x direction. although exact integer pixel shifts are neither generally encountered nor necessary for the resolution process. This illustrative example corresponds to the $I_{+x}$ image 20 and the $I_{-x'}$ image 26'a of FIG. 4 being offset from one another such that the negative ghost $I_{-x'}$ (lipid) image 26'a is shifted to the right relative to the $I_{+x}$ (lipid) image 20. The $I_{+x}$ and $I_{-x'}$ lipid reference points 28b′ and 28b″ for the two images clearly show this +x offset in FIG. 4.

Referring to FIG. 5, and with the foregoing assumptions, it is seen that the composite image of FIG. 4 may be represented as an $I_{+x}$ pixel array 42 and an $I_{-x}$ pixel array 44 shifted to the right by two pixels (i.e. M=2). A resolved $I_{+x}$ lipid image may be obtained by eliminating the negative offset ghost ($I_{-x'}$) image from the composite image by the process defined by equation 13.

As shown in FIG. 5, the pixels in both the first column (j=1) and the second column (j=2) contain only values of the lipid image $I_x$. Accordingly, the values in these pixels may be taken directly as the values in the corresponding pixels of the resolved $I_x$ image. However, the remaining pixels ij (for j 2) of the composite image each contain (as shown by equation 12) the desired value $L_{ij}$ of the resolved ($I_{+x}$) image and a negative offset ghost value $L_{i,j-\delta x}(=L_{i,j-2})$. From equation 13, and as shown in FIG. 5, the desired value $L_{13}$ of pixel 1,3 of the resolved image is equal to the composite value $S_{13}$ in pixel 1,3 of the composite image plus the value $L_{11}$ in pixel 1,1 of the resolved image. Similarly, the value $L_{14}$ in pixel 1,4 of the resolved image is equal to the value $S_{14}$ in that pixel of the composite image plus the value $L_{12}$ in pixel 1,2 of the resolved image and so on. Accordingly, the value in each of the pixels in any of rows i=1 to 6, columns j=3 through 6 of the resolved image may be determined by adding to the composite image value in each pixel the resolved image value from the pixel in the same row and two columns to the left of the pixel, as indicated in FIG. 5. This process (which is, in effect, a deconvolution process) may be iterated for each pixel, processing through the image from left to right, and down one row at a time, until the $I_{+x}$ lipid image is completely resolved.

Once a resolved lipid image is obtained, a resolved water image may be obtained by subtracting the resolved lipid image, properly offset, (e.g. by a distance Δ) from either the $I_{+x}$ image or the $I_{-x'}$ image (or even the $I_{-x}$ image if the mirror image of the resolved image is used to obtain a mirrored water image) or alternatively from both and averaging the results. If only a water image is desired, the foregoing process could, of course, be performed by first registering the lipid components of the $I_{+x}$ image and the mirrored $I_{-x}$ (or $I_{-x'}$) image, then subtracting and finally deconvolving the composite water image along the X-axis (rows) thereof to produce a resolved water image directly.

Although the foregoing process has been described in the context of mirroring, registering, subtracting and deconvolving "images", in actual practice NMR images are constructed by processing (in a well-known manner) the NMR signals received from a sample in the computer of the NMR imaging system to produce arrays of numbers that represent the intensity of the NMR image at each pixel in the NMR display. Accordingly, the mirroring, registering, subtracting and deconvolving process of the invention may be implemented as a rather straightforward data-processing routine by a computer program that operates on the arrays of numbers that represent the intensities of the NMR images in each pixel. By adjusting the chemical shift to be an integral number M of one-half the pixel dimension in the projection direction, so that the total shift 2Δ is an integral number of pixels (as shown, for example, in connection with FIG. 5), it will be appreciated that the computer program required to implement the process becomes quite simple. If the chemical shift does not constitute an integral number of pixels, it merely becomes necessary to employ an interpolation process for deriving the required values for the pixels of the resolved image. The deconvolution process may also be implemented in hardware as a recursive filter.

As noted earlier, the method of the invention may be analogized to solving two simultaneous equations in two unknowns. In order to resolve and separate two image components from an image, it is necessary to have two NMR images containing such components. The images may be produced by any of a variety of conventional NMR imaging sequences that enable images to be constructed from opposite-gradient-polarity projections onto the same line, and, as noted above, it is preferable (but not necessary) that the projection direction be one of the axes of the coordinate system in use in the apparatus. Two-dimensional-Fourier-transform (2DFT) imaging techniques conveniently allow images to be constructed from projections. In constructing the images, it is desirable to interleave the projections by first taking a projection in a first direction along the chosen (e.g. X) axis and then taking a projection in the opposite direction along the same axis, so as to minimize problems due to patient motion and machine (e.g. gradient field temporal) instability.

From the foregoing, it will be appreciated that the invention provides an improved method of NMR imaging that conveniently enables images due to chemically-shifted nuclei to be separated and resolved so as to afford artifact-free images having high spatial resolution. It can now be seen that the method can be extended, by iteration, to species with more than two dominant peaks.

While a presently preferred embodiment of the invention has been shown and described, it will now be appreciated by those skilled in the art that many modifications and variations can be made therein. It is our intent to be limited only by the scope of the appending claims, and not by the specific details or instrumentalities presented herein by way of explanation of our presently preferred embodiment.

What we claim is:

1. A method for obtaining a high-spatial-resolution NMR image of a sample containing first and second chemically-shifted nuclei, the method comprising the steps of:
    (a) forming a first NMR image of a selected region of the sample from projections along a first line extending in a first direction;
    (b) forming a second NMR image of the selected region from projections along the same first line but extending in a second direction;
    (c) selecting the second direction to be opposite to the first direction and to cause the first and second NMR images to each comprise a first image component produced by the first nuclei and a second image component produced by the second nuclei and with the second image component offset from the first image component by the chemical shift between the first and second nuclei;
    (d) mirroring the second NMR image about a second line orthogonal to the first line;
    (e) registering the first image components of the first and mirrored second NMR images;
    (f) combining the first and mirrored second registered NMR images so as to eliminate the first image components and to produce a composite image containing second image components; and
    (g) processing the composite image to produce a resolved image containing substantially only the second image component of the first NMR image.

2. The method of claim 1, wherein said combining step (f) comprises the step of: subtracting the registered mirrored second NMR image from the first NMR image to cause the composite image to be comprised of the second image component of the first NMR image and the negative of the second image component of the mirrored second NMR image.

3. The method of claim 2, further comprising the step of: adjusting the amplitudes of the first image components of the first and mirrored second NMR images to be the same prior to carrying out the subtracting step (f).

4. The method of claim 2, wherein the subtracting step includes the steps of: superimposing the negative of the second image component of the mirrored second NMR image upon the second image component of the first NMR image; and offsetting the negative mirrored second image component of the second NMR images from the second image component of the first NMR image by twice the chemical shift in the first direction to obtain the composite image.

5. The method of claim 4, wherein each image comprises an array of elements, and wherein said processing step (g) comprises the step of: adding elements of the second image component of the first NMR image to elements of the composite image that are offset therefrom by twice the amount of the chemical shift, to eliminate the negative second image component from the composite image and produce the resolved image.

6. The method of claim 5, wherein the array of elements comprises an array of pixels, each pixel corresponding to a distinct portion of the image and having an associated pixel value that defines the intensity of the image in such portion, and wherein the adding and subtracting steps respectively comprise the steps of adding and subtracting pixel values.

7. The method of claim 6, further comprising the step of: adjusting the offset value and pixel size to cause the chemical shift to substantially correspond to an integral number M of one-half the dimension of the pixels in the direction of the first line.

8. The method of claim 7, wherein said processing step (g) comprises the steps of: (g1) selecting as resolved pixel values for a first M columns of pixels of each row of the resolved image a respective pixel value of the same one of a first M columns of the same row of the composite image that correspond to only the second image component of the first NMR image; (g2) determining the pixel value for each of the M+1-st through last columns of the same row of the resolved image by adding to the pixel value for that column of the composite image the resolved pixel value for that pixel of the same row and the M-th previous column; and (g3) thereafter determining the pixel values of the pixels of the remaining rows of the resolved image by repeating steps (g1) and (g2) for each of the remaining rows.

9. The method of claim 1, further comprising the step of: subtracting the resolved image, offset by the amount of the chemical shift, from one of the first and second NMR images to produce another resolved NMR image containing only a first image component.

10. The method of claim 1, further comprising the step of: providing first and second pluralities of reference points corresponding, respectively, to the first and second nuclei in the first and second NMR images; and wherein the registering step (e) includes the step of: registering at least one plurality of the first and second pluralities of reference points in each of the first and mirrored second images.

11. The method of claim 1, wherein the image-forming steps (a) and (b) each comprise the step of: forming the associated one of the first and second NMR images using a two-dimensional-Fourier-transform imaging technique.

12. A method for obtaining a high-spatial-resolution NMR image of a sample containing first and second chemically-shifted nuclei, the method comprising the steps of:
    (a) forming first and second NMR images of a selected region of the sample, each of the first and second NMR images comprising a first image component produced by the first nuclei and a second image component produced by the second nuclei and offset in first and second respective directions along a common line from the first image component;

(b) mirroring the second NMR image;

(c) registering the first image components of the first and mirrored second NMR images;

(d) combining the first and mirrored second registered NMR images so as to eliminate the first image components and to produce a composite image containing second image components; and (e) processing the composite image to produce a resolved image containing the second image component of the first NMR image.

13. The method of claim 12, wherein each image comprises an array of pixels, each pixel having an associated value representative of the intensity of the image in such pixel, and wherein the registering and combining steps (c) and (d) include a step of: subtracting each pixel value of the mirrored second NMR image from a corresponding pixel value of the first NMR image to cause the composite image to comprise the second component of the first NMR image and a negative of the second component of the mirrored second NMR image superimposed upon and offset from the second component of the first NMR image.

14. The method of claim 13, wherein the image forming step (a) comprises the step of: forming the first and second NMR images with first and second pluralities of reference points corresponding, respectively, to the first and second nuclei; and wherein the subtracting step comprises the step of: subtracting pixel values to cause pixel values of the mirrored second NMR image corresponding to the first plurality of reference points to be subtracted from pixel values of the first NMR image corresponding to the first plurality of reference points.

15. The method of claim 13, wherein the image forming step (a) comprises the step of: forming the first and second NMR images with the offset substantially corresponding to an integral number of pixels.

16. the method of claim 15, wherein the processing step (e) comprises the step of: adding pixel values of the composite image that do not have a portion representative of the negative of the second component to pixel values of the composite image that do have a portion representative of the negative of the second component, to eliminate from such pixel values the portion representative of the negative of the second component.

17. The method of claim 12, further comprising the step of: subtracting the resolved image, offset by the amount of the chemical shift, from one of the first or second NMR images to produce another resolved NMR image of the first image component.

18. The method of claim 12, further comprising the steps of: subtracting the resolved image, offset by the amount of the chemical shift, from each of the first and second NMR images; and averaging the results to produce another resolved NMR image of the first image component.

19. The method of claim 12, wherein the first nuclei comprise water nuclei and the second nuclei comprise lipid nuclei.

* * * * *